(12) United States Patent
Zhang et al.

(10) Patent No.: US 7,989,882 B2
(45) Date of Patent: Aug. 2, 2011

(54) TRANSISTOR WITH A-FACE CONDUCTIVE CHANNEL AND TRENCH PROTECTING WELL REGION

(75) Inventors: Qingchun Zhang, Cary, NC (US);
Anant Agarwal, Chapel Hill, NC (US);
Charlotte Jonas, Morrisville, NC (US)

(73) Assignee: Cree, Inc., Durham, NC (US)

( * ) Notice: Subject to any disclaimer, the term of this patent is extended or adjusted under 35 U.S.C. 154(b) by 362 days.

(21) Appl. No.: 11/952,447

(22) Filed: Dec. 7, 2007

(65) Prior Publication Data
US 2009/0146154 A1 Jun. 11, 2009

(51) Int. Cl.
*H01L 29/66* (2006.01)
(52) U.S. Cl. ........ 257/330; 257/327; 257/329; 257/334; 257/337; 257/338
(58) Field of Classification Search .................. 257/288, 257/327, 328, 329, 330, 334, 337, 338, E29.262, 257/E29.211, E21.066
See application file for complete search history.

(56) References Cited

U.S. PATENT DOCUMENTS

| | | | |
|---|---|---|---|
| 5,742,076 A | 4/1998 | Sridevan |
| 5,976,936 A | 11/1999 | Miyajima |
| 6,020,600 A | 2/2000 | Miyajima |
| 6,057,558 A | 5/2000 | Yamamoto et al. |
| 6,075,259 A | 6/2000 | Baliga |
| 6,573,534 B1 | 6/2003 | Kumar |
| 6,576,929 B2 | 6/2003 | Kumar |
| 6,791,143 B2 | 9/2004 | Baliga |
| 7,241,694 B2 | 7/2007 | Takeuchi |
| 2002/0167011 A1 | 11/2002 | Kumar |
| 2002/0185679 A1 | 12/2002 | Baliga |
| 2004/0048488 A1 | 3/2004 | Baliga |
| 2005/0035401 A1 | 2/2005 | Yamaguchi et al. |
| 2005/0077570 A1* | 4/2005 | Nishinohara ................. 257/336 |

(Continued)

FOREIGN PATENT DOCUMENTS

DE   10 2005 052 731 A1   5/2006

(Continued)

OTHER PUBLICATIONS

H. Yano et al., "High Channel Mobility in Inversion Layers of 4H-SiC MOSFET's by Utilizing (1120) Face," IEEE Electron Device Letters, vol. 20, No. 12, Dec. 1999, pp. 611-613.
European Search Report for EP 08 17 0802, mailed May 3, 2010.
Tan, J. et al., "High-Voltage Accumulation-Layer UMOSFET's in 4H-SiC," IEEE Electron Device Letters, Dec. 1998, vol. 19, No. 12, pp. 487-489, IEEE.

*Primary Examiner* — N Drew Richards
*Assistant Examiner* — Joannie A Garcia
(74) *Attorney, Agent, or Firm* — Withrow & Terranova, P.L.L.C.

(57) ABSTRACT

A transistor structure optimizes current along the A-face of a silicon carbide body to form an AMOSFET that minimizes the JFET effect in the drift region during forward conduction in the on-state. The AMOSFET further shows high voltage blocking ability due to the addition of a highly doped well region that protects the gate corner region in a trench-gated device. The AMOSFET uses the A-face conduction along a trench sidewall in addition to a buried channel layer extending across portions of the semiconductor mesas defining the trench. A doped well extends from at least one of the mesas to a depth within the current spreading layer that is greater than the depth of the trench. A current spreading layer extends between the semiconductor mesas beneath the bottom of the trench to reduce junction resistance in the on-state. A buffer layer between the trench and the deep well further provides protection from field crowding at the trench corner.

26 Claims, 13 Drawing Sheets

U.S. PATENT DOCUMENTS

| | | | |
|---|---|---|---|
| 2005/0212057 A1* | 9/2005 | Tokuda et al. | 257/378 |
| 2005/0233539 A1 | 10/2005 | Takeuchi | |
| 2006/0180836 A1* | 8/2006 | Ishida et al. | 257/288 |
| 2008/0149963 A1* | 6/2008 | Adan | 257/190 |

FOREIGN PATENT DOCUMENTS

| | | |
|---|---|---|
| EP | 1 128 427 A2 | 2/2001 |
| EP | 1 850 395 A2 | 10/2007 |
| WO | WO 02/09177 A2 | 1/2002 |

* cited by examiner

TRANSISTOR WITH A-FACE CONDUCTIVE CHANNEL AND TRENCH PROTECTING WELL REGION

BACKGROUND

The invention relates to transistor structures, particularly useful in MOSFETs, in which the conductive channel is formed on the A-face of the semiconductor body. The problems addressed by this invention include (i) reducing channel resistance in the on-state for optimal current output and (ii) minimizing field crowding effects to maximize the reverse voltage blocking capabilities within the device.

Over the last twenty years, transistor designs have been optimized to achieve a controlled current flow in the on-state while simultaneously having the ability to block certain voltages in the off-state. The development of better semiconductor materials, including silicon carbide and the Group III nitrides, has led to extraordinary advancements in transistor design that allow greater control over transistor performance in both the on-state (e.g., higher current output) and the off-state (higher voltage blocking with less leakage current). Silicon carbide has been of particular interest due to its electrical characteristics in a variety of crystal structures.

Silicon carbide's crystal structure is often described by the elemental configuration of the layer being used. A cross section of a silicon carbide substrate shows either a layer of carbon atoms directly on top of a layer of silicon atoms, or vice versa. The silicon layer is often polished and used for forming devices thereon, and it is known as the silicon face. If the carbon layer is exposed, it is known as the carbon face. See Zetterling, Carl-Mikael, *Process Technology for Silicon Carbide Devices*, Institute of Electrical Engineers (2002), Page 3.

The axes of alignment for the silicon carbide crystal also play important roles in choosing the orientation for forming a semiconductor device. Traditionally, for hexagonal crystal structures, four principal axes are commonly used: a1, a2, a3, and c. All of the a-vectors are in the same plane ("the a-plane), and the c-vector is in the c-plane that is perpendicular to the a-plane. Ibid.

Prior researchers have attempted to use different planes, or faces, of the silicon carbide crystal to achieve various performance characteristics in the resulting device. Yano, et al., for example, disclose the channel mobility characteristics of MOSFETS formed on the c-face and improved results for inversion layer mobility on the a-face of a 4H—SiC substrate. See Yano, Kimoto, Matsunami, Asano, and Sugawara, "High Channel Mobility in Inversion Layers of 4H—SiC MOSFETs by Utilizing (11$\bar{2}$0) Face," IEEE Electron Device Letters, Vol. 20, No. 12 (December 1999), Pages 611-613.

Yano et al. formed two types of MOSFETs with currents perpendicular to one another on the same substrate. Drain current for the MOSFET formed on the (11$\bar{2}$0) face improved substantially, showing a significant increase in channel mobility by using the a-face (11$\bar{2}$0) of the silicon carbide. Yano's design, however, is not preferable in vertical power devices because the Yano devices have a lower critical field and conduct under reversed bias at lower gate voltages than desired. The sole technique of developing the MOSFET on the a-face, without additional parameters being adjusted as well, has not proven to be the best answer in the context of optimizing performance in power MOSFETs.

Previous efforts to maximize current flow in power MOSFETs have addressed the channel resistance of the silicon carbide devices, as channel resistance creates a significant part of the total MOSFET on-resistance, especially for low voltage (<2 kV) silicon carbide MOSFETs. Approaches to reducing the channel resistance have focused on (1) improving channel mobility, (2) reducing device cell pitch, and (3) reducing channel length. Although research efforts have studied these approaches extensively, DMOSFETs (double diffused metal oxide semiconductors FETs) and UMOSFETs (trench gated metal oxide semiconductor FETs) of the prior art have shown only marginal improvements in achieving the desired increase in channel mobility. For example, known UMOSFETs show an increased carrier density in the conductive channel, but these same devices suffer from the electrical field crowding at the trench gate corners under reverse bias.

FIGS. 1 and 4 show a prior art DMOSFET (5) and a prior art UMOSFET (28) respectively. A traditional DMOSFET (5) includes source, gate, and drain contacts (10, 11, 12) positioned on a semiconductor body (18) with the gate contact (11) atop an oxide layer (15) insulating the gate region. The DMOSFET (5) includes a p+ type well (19) implanted into the semiconductor to a depth of about 0.5 microns and doped to about 1e20 cm$^{-3}$. An n+ source region (20) doped to about 1e20 cm$^{-3}$ is adjacent the p+ well (19) and positioned between the p+ well (19) and the buried channel (21). The buried channel (21) extends across portions of the source (20), the p+ well (19) and the semiconductor body (18) between active regions, i.e., the JFET region (23). The buried channel (21), the JFET region (23), and the supporting drift region (24) of the DMOSFET (5) are doped to about 1e16 cm$^{-3}$. In a typical prior art DMOSFET, the fabrication process controls the channel surface by using ion implantation instead of doping during layer growth. Ion implantation is difficult to achieve accurately in DMOSFETs, and the resulting devices are limited in channel mobility.

The channel resistance of the DMOSFET (5) of FIG. 1 is set forth in the forward voltage v. current curves of FIG. 2. As shown therein, the DMOSFET (5) of FIG. 1 achieves channel mobility of 40 cm$^2$/Vs and a specific on resistance of about 4.62 mΩ·cm$^2$. Accordingly, FIG. 3 shows the forward current distribution of the prior art DMOSFET (5) of FIG. 1. These values are in line with known DMOSFETs that achieve a typical channel mobility of between about 25 to 50 cm$^2$/Vs. As shown in FIG. 3, the current distribution in the drift region (24) of the device is far less than the optimal current in the upper portion (23) closer to the gate. FIG. 3 shows that the current is not spreading as desired for maximum flow through the device to the drain (12).

The prior art UMOSFET (28) of FIG. 4 suffers similar current restrictions. As set forth in the drawing, UMOSFET (28) includes the standard source (30), gate (31), and drain (32) with the gate (31) atop an oxide layer (33) lining a trench (36). The buried channel (38) of the UMOSFET (28) extends across the source (30) and down into the trench (36) such that the buried channel (38) is between the epitaxial layers of the p-n junction (40, 41) and the oxide layer (33). The problem with the prior art UMOSFET is that the corner of the trench (42) exhibits a noted crowding of the electric field at the corner of the trench, inhibiting current flow through the drift region (43) and the substrate (44) down to the drain (32). The field crowding also results in a lower sustained gate voltage during reverse bias operation.

The UMOSFET of FIG. 4 also requires a trench that is greater than 2 microns for proper gate placement and operation. Given that reactive ion etching is often the method of choice for forming a trench in a UMOSFET, the trench wall is so severely damaged in the fabrication process that the conductive channel is constricted. Uniform results are difficult to achieve when subjecting silicon carbide to reactive ion etching, and the resulting devices are not reliable. The damage caused by the etching also deteriorates the oxide quality formed thereon for insulation purposes. These factors combine in prior art UMOSFETs to require an on-voltage of up to 30 volts for forward conduction.

Prior art DMOSFET and UMOSFET devices of FIGS. 1 and 4 illustrate the common need for modifications to transistor design that increases maximum current flow in the on state with the ability to block incident voltages in reverse biased operation.

U.S. Pat. No. 5,976,936 (Miyajima 1999) shows another example of a prior silicon carbide MOSFET developed with the goal of increasing current in the channel while controlling the threshold voltage and blocking characteristics for the device. The Miyajima '936 patent utilizes a vertical layer of silicon carbide along the gate trench wall for the channel layer. The vertical channel layer is quite thin—about 1000 to 5000 angstroms. The Miyajima '936 design, however, still suffers the problem of current crowding at the edges of the trench. Miyajima, furthermore, makes no reference to using the a-face of the silicon carbide crystal to enhance channel mobility.

Published U.S. Patent Application 20020185679 (Baliga 2002) addresses some of the same issues in simultaneously supporting large voltages and operating in a current saturation mode. The Baliga '679 patent application uses deep well extensions (P+ implants), which could arguably alleviate the current crowding at the trench corners. Previous research into these well extensions, however, showed that the deep wells typically resulted in a high JFET resistance, thereby requiring a deeper trench. Baliga actually encourages the JFET effect by using deep P+ wells to deplete the region adjacent the wells. Baliga then uses the JFET effect to operate the depleted region of the device as a field effect transistor while the drain region is in current saturation mode. The problem of the JFET region constricting the current flow to the drain is still evident in Baliga's device.

Prior efforts to achieve a power transistor with high current output in the on-state and reduced current crowding at the gate trench under reversed bias have been largely unsuccessful. The prior art has been unsuccessful in addressing the competing factors of decreasing channel resistance along a gate trench sidewall and increasing the capacity of the device to spread the electric field across the semiconductor device under reversed bias.

BRIEF SUMMARY OF THE INVENTION

The invention is a new transistor structure (50) that optimizes current along the A-face of a silicon carbide body (65) while minimizing the JFET effect in the drift region (55) during forward conduction in the on state. The invention further shows high voltage blocking ability due to the addition of a highly doped well region (77) that protects the gate corner region (80) in trench-gated device.

For transistor devices utilizing an etched trench (56) in a semiconductor body for the gate contact (61), conduction along the trench sidewall can be enhanced by providing a conductive path (72) across the A-face of the semiconductor, preferably silicon carbide. In accordance with this invention, transistors advantageously use the A-face conduction along a trench sidewall in addition to a buried channel layer (72) extending across portions of the semiconductor mesas (65) defining the trench (56). A doped well (77) extends from at least one of the mesas to a depth within the current spreading layer, or drift region (55) that is greater than the depth of the trench (56). The current spreading drift layer (55) extends between the semiconductor mesas (65) beneath the bottom of the trench (56) to reduce junction resistance in the on-state.

In another embodiment, semiconductor mesas (65) define a trench (56) there between, and each mesa (65) defines the width of a p-n junction in a respective mesa. A buried channel layer (72) is adjacent the top surface of the device, forming an AMOSFET (50) that utilizes conduction along the A-face of silicon carbide. The buried channel layer (72) extends down and across the trench wall. A deep well region (77), doped, for example, to P+ conductivity, extends from the top of the AMOSFET (50) down to a depth that is greater than the trench (56). The deep P+ well (77) protects the trench corner (80) during reverse bias operation, and allows the device to achieve higher blocking voltages. A doped buffer layer (73) extends across the body of the device from each vertical trench wall toward the deep well region.

The invention utilizes the A-face of silicon carbide to control conduction via a gate contact (61). The A-face of the silicon carbide enhances channel conductivity by increasing transconductance across the semiconductor. A deep well region (77) proximate a buffer region (73) of opposite conductivity type protects the trench corner (80) during reverse bias operation, thereby allowing the device to withstand higher gate blocking voltages.

The method of forming an AMOSFET according to the invention herein includes implanting a doped well region (77) of a first conductivity type in a semiconductor body (65) and then growing a first epitaxial layer (68) of the first conductivity type on the semiconductor body such that the first epitaxial layer (68) covers at least a portion of the doped well region (77). Next, the invention includes forming a pn junction by growing a second epitaxial layer (69) of a second conductivity type on the first epitaxial layer (68) and then etching the epitaxial layers and said semiconductor body to form a pair of mesas. The mesas define a trench (56) there between, wherein the trench has a depth into the semiconductor body that is less than the depth of said doped well region (77). By growing a buried channel layer (72) over a portion of said the second epitaxial layer (68), or source region, and extending the buried channel layer (72) into the trench between said mesas, the method achieves an AMOSFET with improved performance characteristics.

In a different embodiment of the method, instead of growing the epitaxial layers (68, 69) individually, the method encompasses the formation of different conductivity type regions by ion implantation.

DETAILED DESCRIPTION

Figure 5:
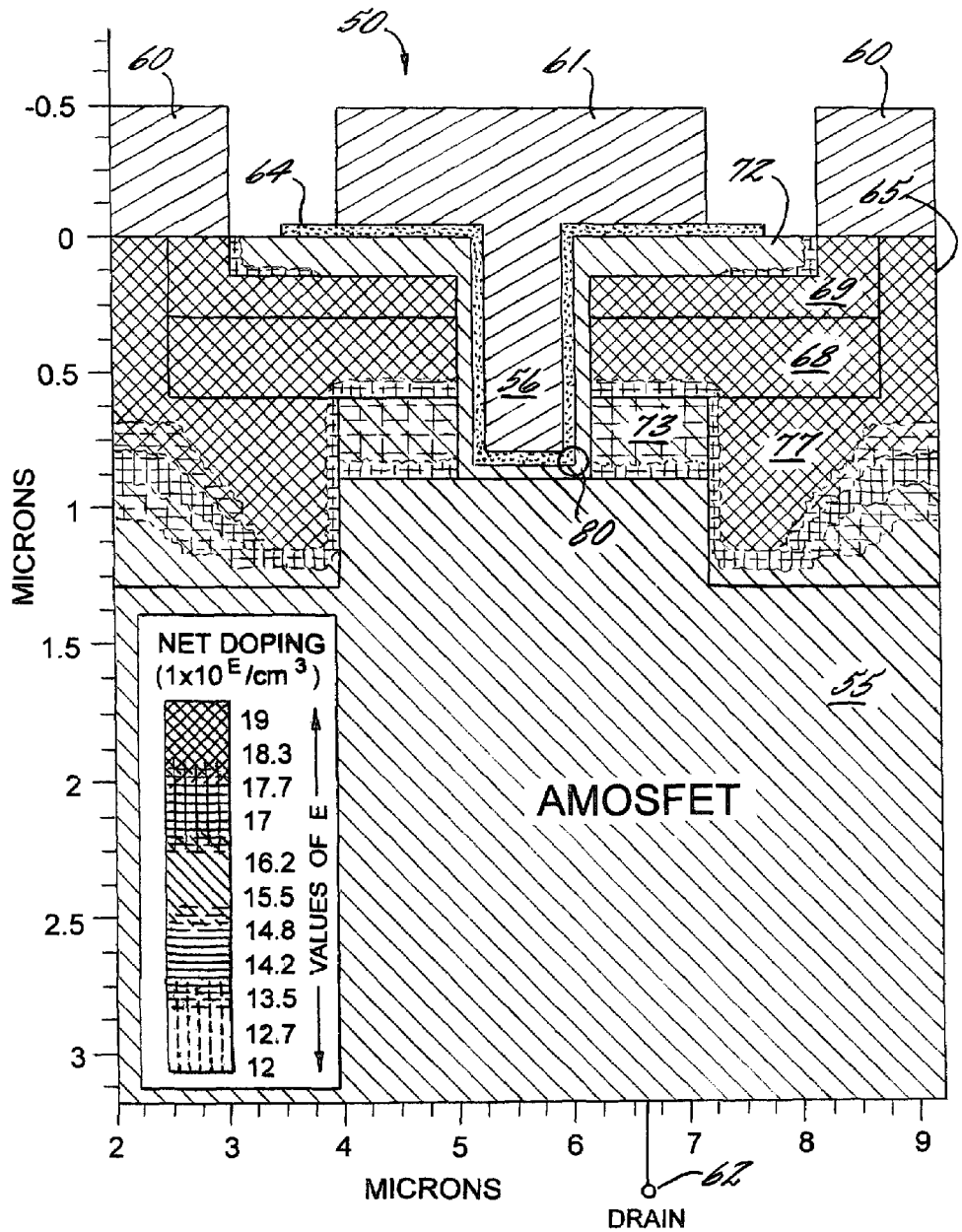
FIG. 5 is a metal oxide semiconductor (MOSFET) formed on the a-face of a silicon carbide crystal structure according to this invention.

The MOSFET of this invention includes a conductive channel on the A-face of a silicon carbide crystal epitaxial layer for increased channel mobility (e.g., up to 200 cm$^2$/Vs for the AMOSFET vs. 100 cm$^2$/Vs or less for prior art DMOSFETs). FIG. 5 sets forth the structure of the new AMOSFET (50). The drift region (55), or current spreading layer, supports epitaxial layers forming the active region of the AMOSFET (50) with current flowing from a source region (60) through the drift region (55), to the drain (62). Broadly, the AMOSFET (50) is a transistor having an insulated gate (61), or control contact, within a trench (56) in a semiconductor crystal structure (58). The trench (56) defines a pair of semiconductor mesas (65) that each encompass a p+ type layer (68) and an n+ type layer (69) forming a pn junction therein. The p+ type layer (68) is an epitaxial layer positioned under a buried channel (72) and between the trench (56) and a p+ doped well (77). The n+ type layer (69) is the source region for conduction purposes. The n+ layer (69) is located adjacent the top of p+ layer (68) and beneath the buried channel (72). The drift region (55) supports the above-noted active regions of the AMOSFET. In a preferred embodiment, the drift region (55) is an N+ epitaxial layer on a substrate and extends between the bottom of the trench and a surface of the AMOSFET opposite the gate contact. The AMOSFET may include more advanced doping techniques such as utilizing a doping concentration in the drift region (55) that increases from a bottom MOSFET surface proximate the drain (62) toward an upper MOSFET surface proximate the source region (69). In this embodiment, the most highly doped region of the drift layer is adjacent said P+ well (77).

The drain contact (62) is affixed to the bottom of the device, allowing conduction from source to drain across the drift region (55). This conduction is controlled by a voltage on the gate (61) in the trench (56). A positive voltage on the gate, above a certain specified threshold, allows controlled conduction from source to drain so long as the channel region (72) is of the proper resistance and channel length.

An AMOSFET according to this invention includes functional transistor features including source, gate, and drain contacts (60, 61, 62) with the gate contact (61) formed atop an insulating oxide layer (64) within the trench (56). The source contact (60) is located on a first surface of the AMOSFET (50) and extends across upper portions of the p+ doped well (77) and the n+ source region (69).

In a preferred embodiment, a buffer layer (73) extends from the p+ well region (77) toward the bottom of the trench (56) with the oxide layer (64) and gate contact (61) inside the trench (56). With the buffer layer (73) properly positioned adjacent the trench corner (80), the p-n junctions between the p+ epitaxial layer (68), the n type buffer layer (73) and the p+ type doped well (77) are sufficiently doped to merge, thereby protecting the trench corner in the off, or non-conductive state. This allows the AMOSFET (50) to withstand higher voltages on the gate (61) without leakage currents toward the drain (62) or even full device breakdown. In a preferred embodiment, the N+ type buffer layer (73) extends to a depth that is approximately equal to the depth of the buried channel layer (72).

In one embodiment, the doping in each layer is sufficient to provide optimal current in the on-state controlled by a gate (61) having a wide range of voltage levels thereon. For example, in the example of FIG. 5, the p+ epitaxial layer (68) is doped to about 5e17 cm$^{-3}$, and the n+ source region is doped to about 1e20 cm$^{-3}$.

The AMOSFET (50) of this invention has a channel layer (72) that is particularly suited for providing high current throughput from source (60) to drain (62), depending on the gate (61) voltage. The buried channel layer (72) extends across portions of the top surface of the semiconductor mesas (65) and at least partially covers the outer walls of the trench (56), including the bottom wall, such that the buried channel layer (72) provides a conductive path across the A-face, the 11$\overline{2}$0 face, of the semiconductor crystal structure forming epitaxial p-n junction layers (68, 69).

The drift, or current spreading layer (55) extends between the semiconductor mesas (65) beneath the bottom of the trench (56) to reduce the junction field effect resistance in the device. In one preferred embodiment, the drift layer (55) extends across the width of the semiconductor mesas (65) and the gate trench (61). The drift layer (55) may rest on a semiconductor substrate to which the drain contact (62) is attached. At least one doped well (77) extends within at least one of the mesas (65) to a depth within the drift region (55) that is greater than the depth of the trench (56).

The doping levels of the device in FIG. 5 are illustrated by the shading in the drawing. While the AMOSFET of this invention is not limited to any particular doping level for any one region, the doping ranges do affect performance, particularly current flow from source to drain. In one example, illustrated by the device of FIG. 5, the doped well (77) is a p+ type well with a doping level of about 1e19 cm$^{-3}$. The n+ source region (69) is doped to about 1e20 cm$^{-3}$, and the p+ epitaxial layer (68) is doped to about 5e17 cm$^{-3}$. To complete the desired characteristics of this embodiment, the buried channel layer (72) has a doping level of about 2e16 cm$^{-3}$; the n+ buffer layer is at about 1e16 cm$^{-3}$, and the drift layer is doped to about 5e15 cm$^{-3}$. Optionally, for enhanced channel characteristics, the n+ source region (69) and the p+ epitaxial layer are at approximately the same fixed potential.

The AMOSFET defines a trench between semiconductor mesas such that the trench exposes the A-face (11$\overline{2}$0) of the semiconductor body. Each mesa includes a pn junction for controlling current flow from the source to the drain. Accordingly, the mesas (65) have a first semiconductor epitaxial layer (68) of a first conductivity type (e.g., P+) extending across the mesa and abutting the trench (56). To complete the pn junction, the mesa (65) includes a second semiconductor epitaxial layer (69) of a second conductivity type (e.g. N+) on the first semiconductor epilayer (68). In the embodiment of FIG. 5, the N+ layer (69) is the source region.

The buried channel (72) extends from the top of one mesa (65), from an area under at least a portion of the source contact (60), down the trench wall along the A-face of the semiconductor, across the trench bottom, up the opposite wall of the trench, and across the surface of the second mesa (65). In other words, the buried channel layer (72) extends from the N+ source region of one mesa to the N+ source region of the opposite mesa, thereby covering the trench walls. The buried channel (72) is then positioned in proximity to the gate contact (61) with an insulating layer (e.g., silicon dioxide) (64) between the gate contact (61) and the buried channel (72). To that effect, at least a portion of the buried channel (72) is between the source region of each mesa and the insulating layer under the gate contact. Overall, the AMOSFET (50) controls electrical conduction in the buried channel (72) along the A-face of the semiconductor body.

To protect the corner (80) of the trench channel and to ease the current crowding effects in that region, the AMOSFET includes a well region (77) have the first conductivity type (e.g. P+) extending from the first epitaxial layer (68) down into the semiconductor mesa body. The AMOSFET (50) of this invention further utilizes a buffer layer (73) having the same conductivity type as the source region (60) (e.g., N+) and extending across at least a portion of the bottom region within each mesa (65), between the trench (56) wall and the well (77). The buffer layer (73) forms a pn junction with the well region (77) of the AMOSFET (50) for further conduction control. In a preferred embodiment, the buffer layer (73) extends from the outer wall of the buried channel (72) to an outer wall of the well (77).

One advantage of utilizing the A-face (11$\bar{2}$0) of a silicon carbide crystal structure according to this invention is that of achieving desired performance with a shallower gate trench than that of the prior art. Prior art trenches in UMOSFETs exceed 2 microns. In one embodiment of the invention herein, the gate trench (56) is less than about 2 microns deep, and in a preferred embodiment, the gate trench (56) is less than about 1 micron deep. A more preferred embodiment utilizes a gate trench (56) of about 0.8 microns deep.

Another characteristic of the AMOSFET of FIG. 5 is the depth of the P+ well (77). The well (77) extends to a depth greater than the buffer layer (73) and even deeper than either the trench (56) or the buried channel (72). The deep P+ well (77) protects the trench corner (80) by shielding the field generated by the gate-semiconductor junction. In a preferred embodiment, the P+ well (77) is approximately 1.3 microns deep, as shown in FIG. 5.

Figure 3:
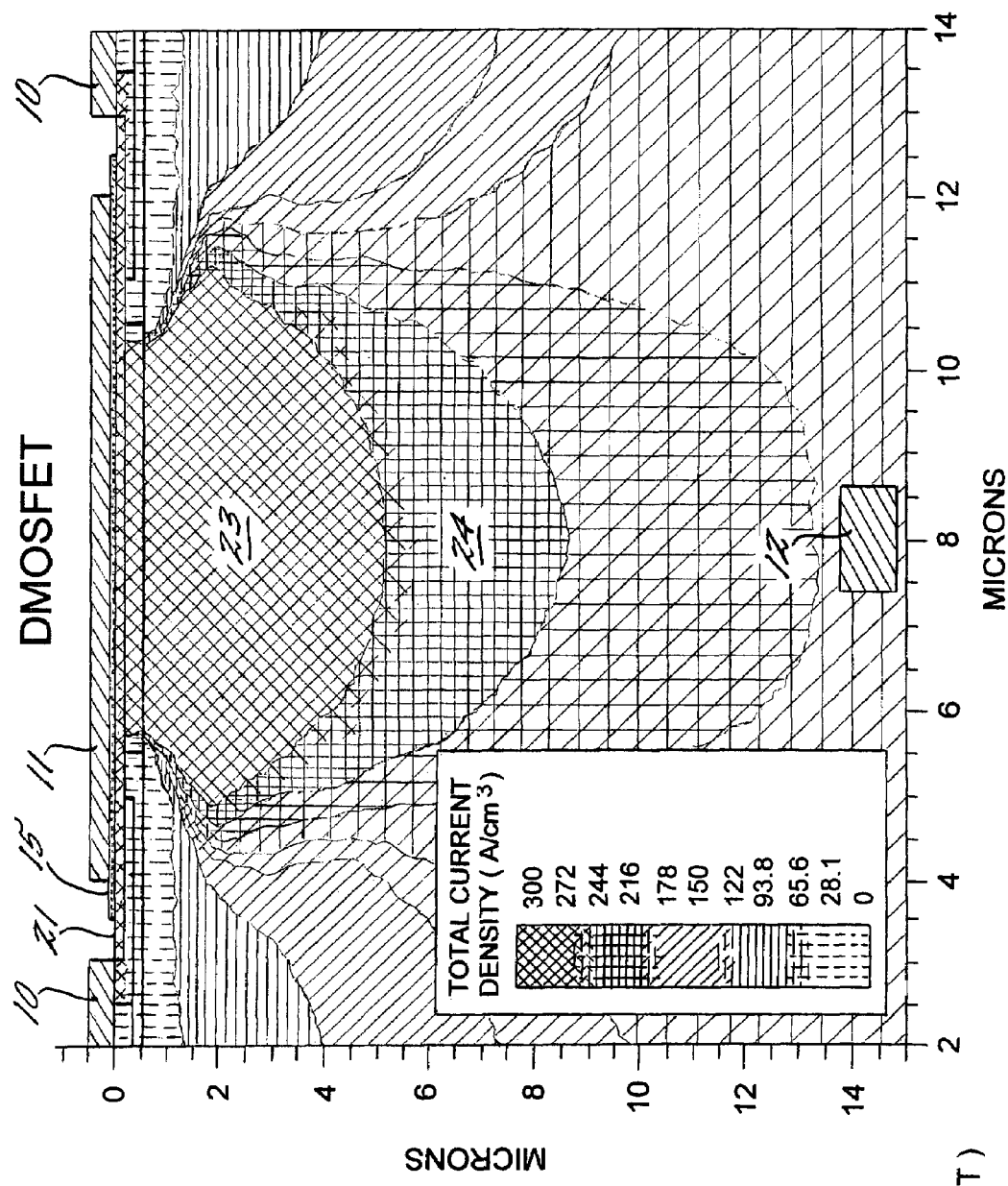
FIG. 3 is a graphical representation of the forward current distribution of the prior art DMOSFET of FIG. 1.
Figure 4:
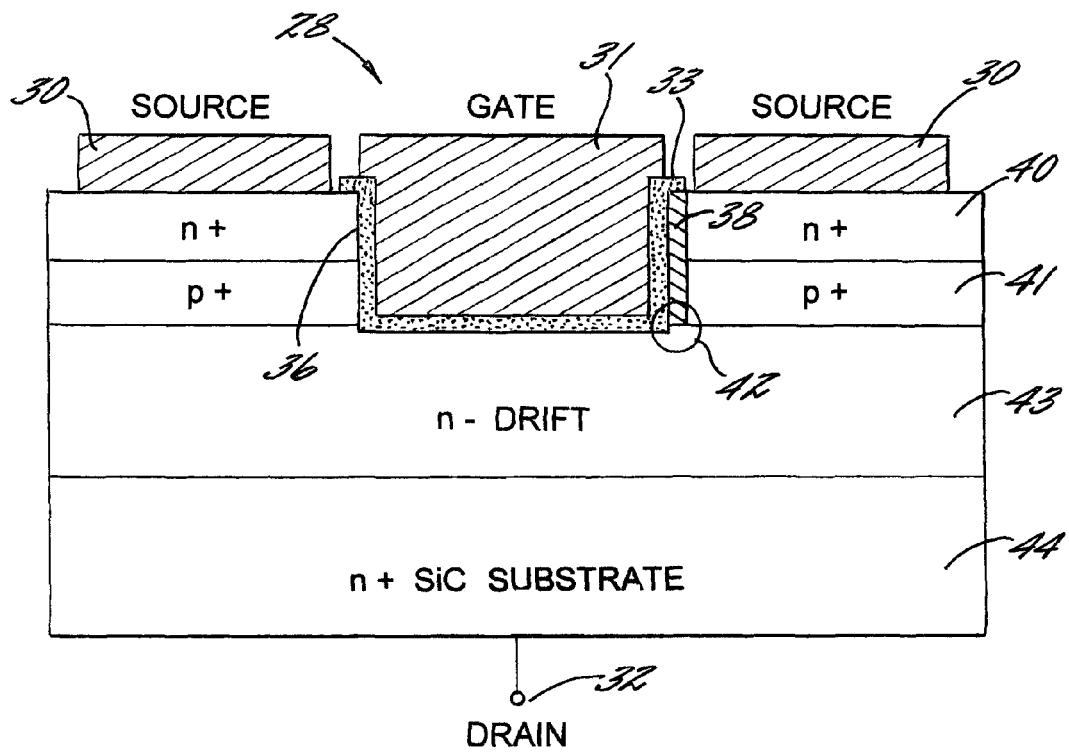
FIG. 4 is a prior art trenched gate field effect transistor (UMOSFET) having a conductive channel along the vertical trench wall.
Figure 6:
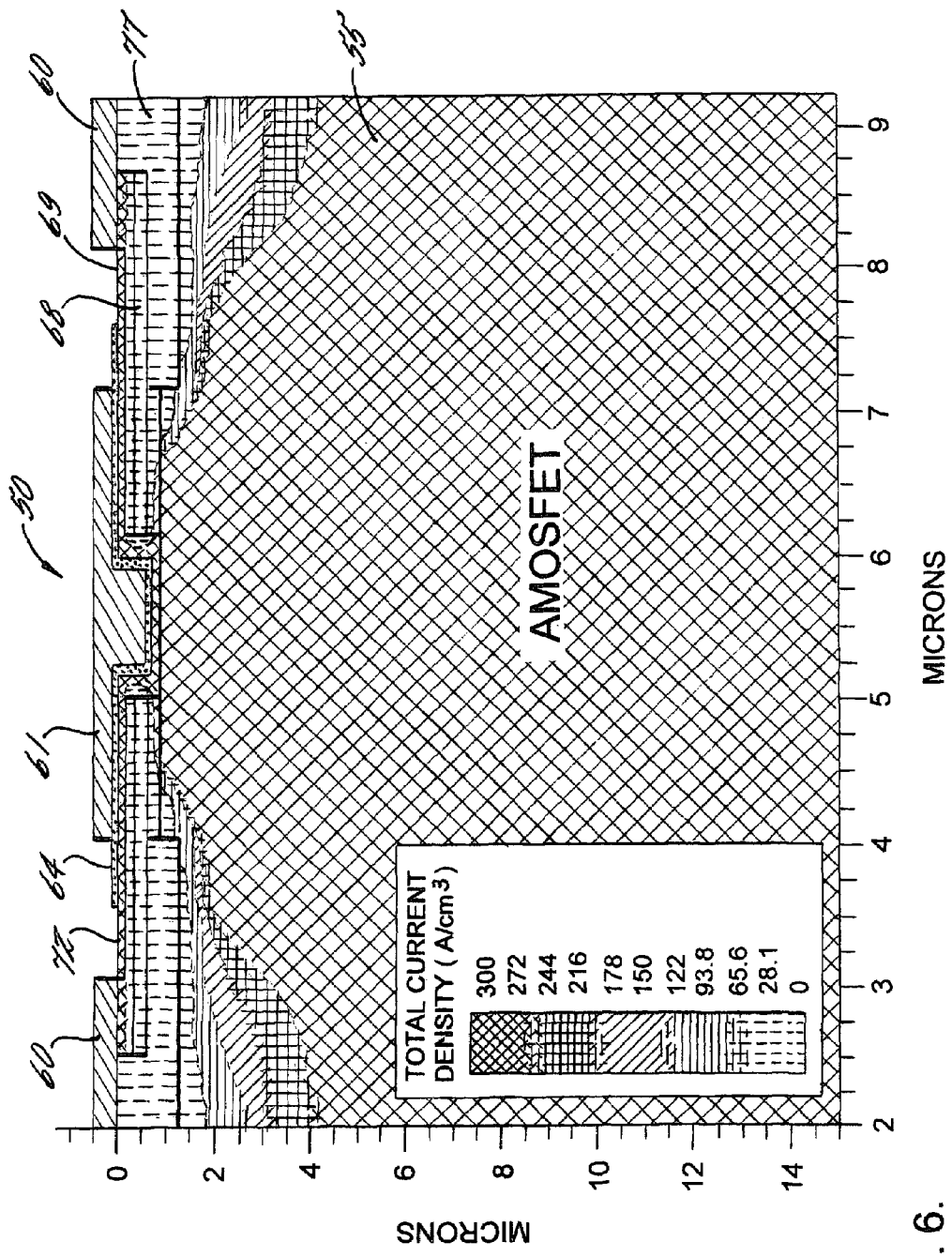
FIG. 6 is a graphical illustration of the forward current vs. voltage curves for the MOSFET formed on the a-face of silicon carbide according to this invention.

As shown in FIG. 6, the forward current distribution is greatly enhanced across a larger section of the drift region (55) due to the additional depth of the P+ well (77) and the use of the buffer layer (73) as shown in FIG. 5. It is significant that the current density distribution approaches 300 A/cm2 over a predominant portion of the AMOSFET of FIG. 6, particularly in the drift region (55). By comparison, the DMOSFET of FIG. 3 achieves a current density in the 300 A/cm2 range within a significantly smaller region of the drift region. Most of the drift region of the DMOSFET tested in FIG. 3 achieved a current density in the range of 200-225 A/cm2.

Figure 1:
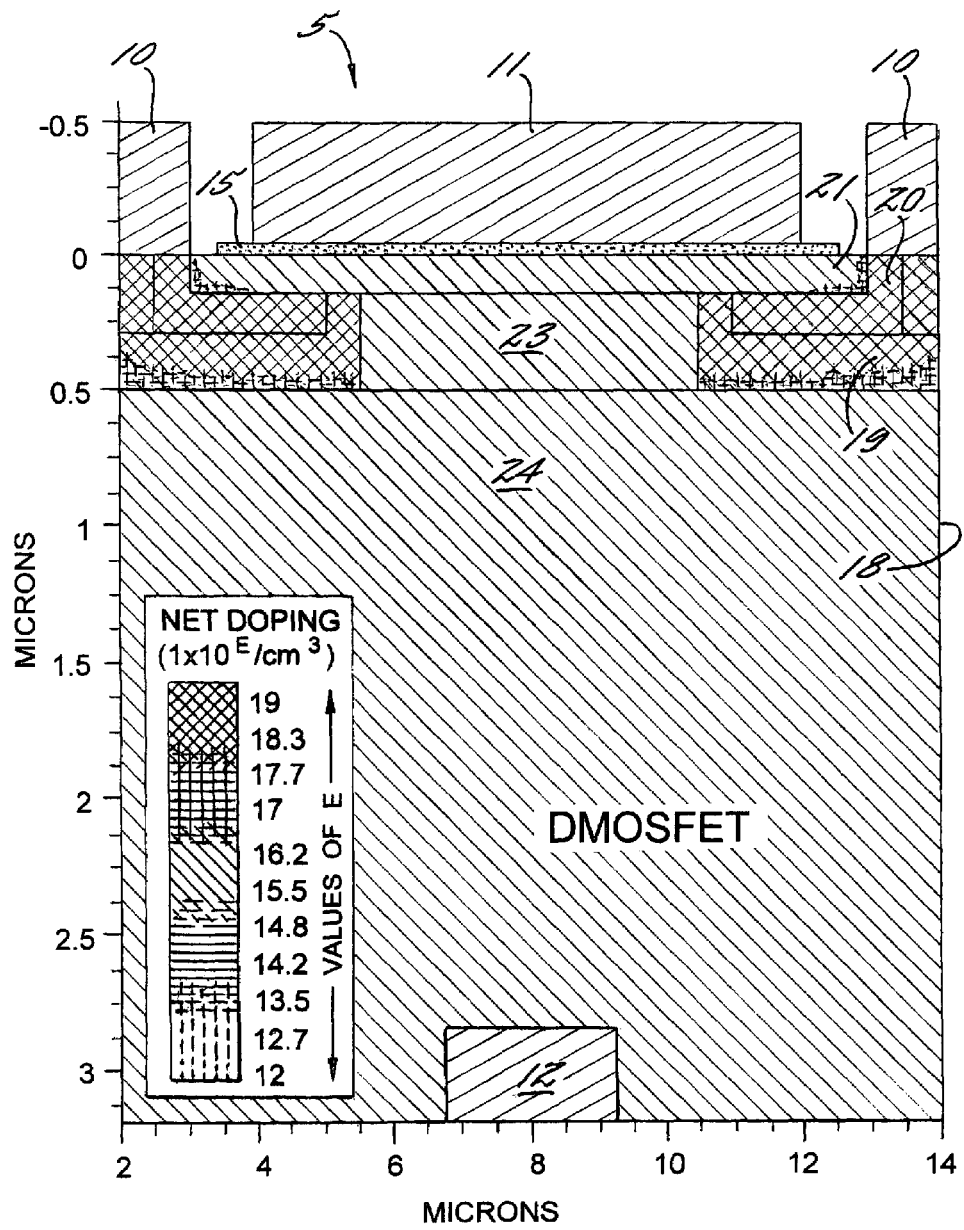
FIG. 1 is a prior art double diffused field effect transistor (DMOSFET) having a buried channel
Figure 2:
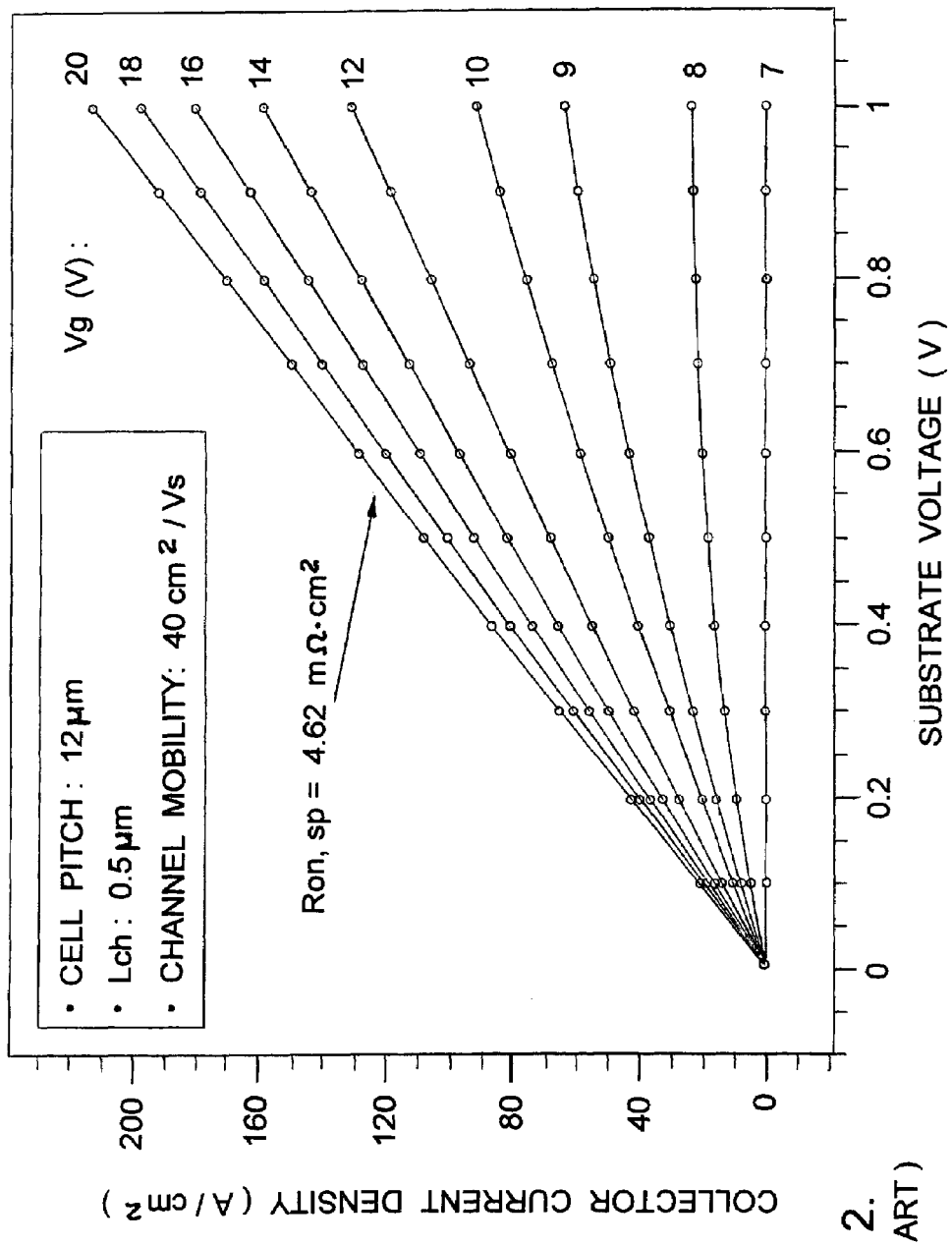
FIG. 2 is a graphical representation of the forward IV curves for the prior art DMOSFET of FIG. 1.
Figure 7:
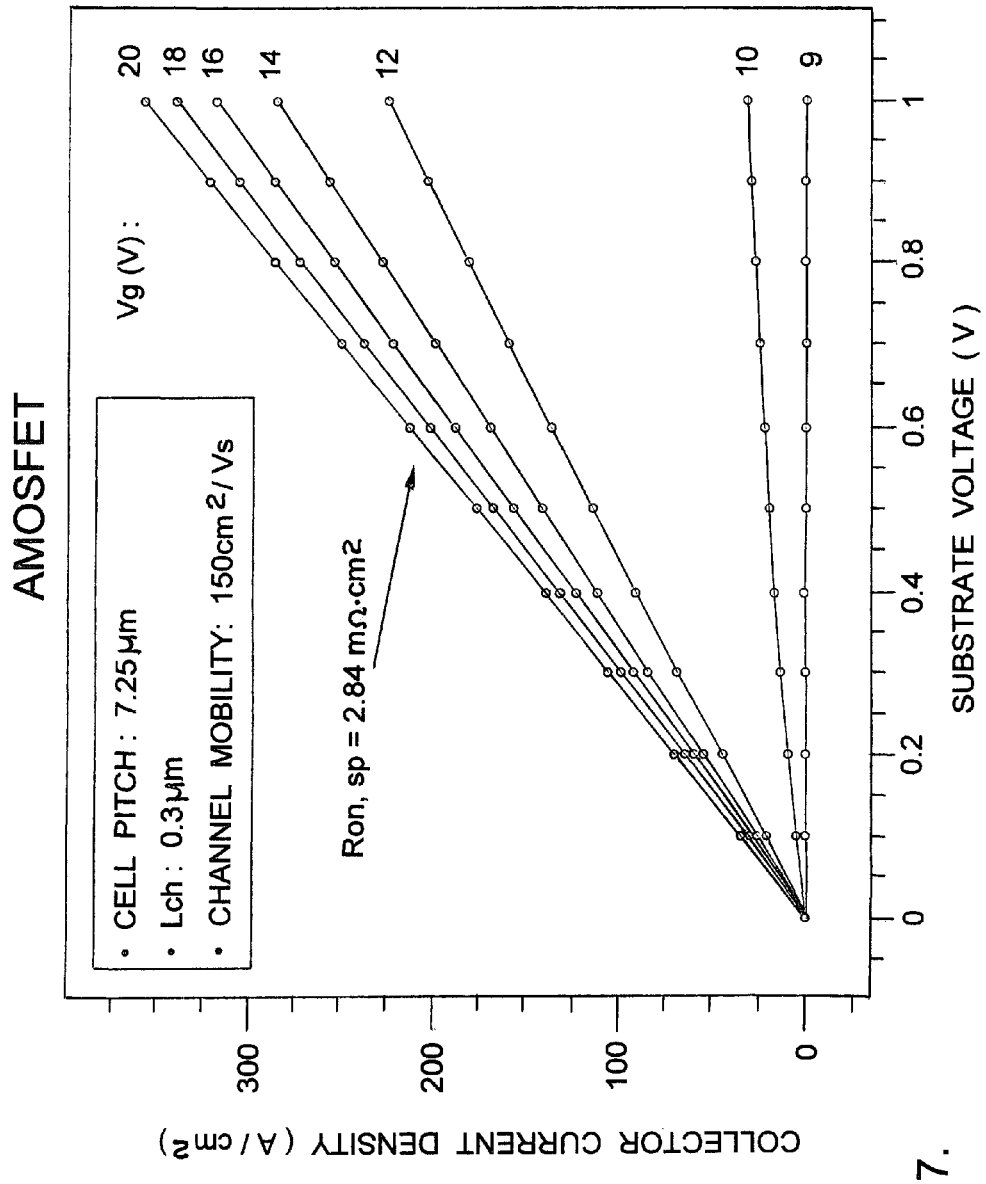
FIG. 7 is a graphical illustration of the forward current distribution for the MOSFET formed on the a-face of silicon carbide according to this invention.

FIG. 7 illustrates the current output for various gate voltages applied to the AMOSFET device of FIG. 5. The specific on resistance of 2.84 mohms·cm$^2$ is a significant improvement over the on resistance of 4.62 for the prior art DMOSFET as shown in FIG. 2. Using the silicon carbide A-face in the AMOSFET according to this invention results in significant diminution of the resistance in the channel.

The AMOSFET described herein has a lower on-resistance due to a high channel mobility, a short channel length, a reduced JFET resistance within the semiconductor body, and a high channel density. The high channel mobility exhibits a higher transconductance through the buried channel (72) along the A-face (11$\bar{2}$0). Reducing channel crowding aids in achieving higher current throughput along the A-face. These qualities are achieved in a fabrication process that includes a shallow trench etching down to less than about one micron. Other embodiments of the invention utilize a trench depth between about 1 micron and 2 microns, which is significantly smaller than trench depths of prior art devices. By incorporating these improvements into MOSFET design, the AMOSFET achieves a threshold voltage $V_t$ less than about 3 volts, and preferably about 2 volts for forward conduction.

Figure 8A:
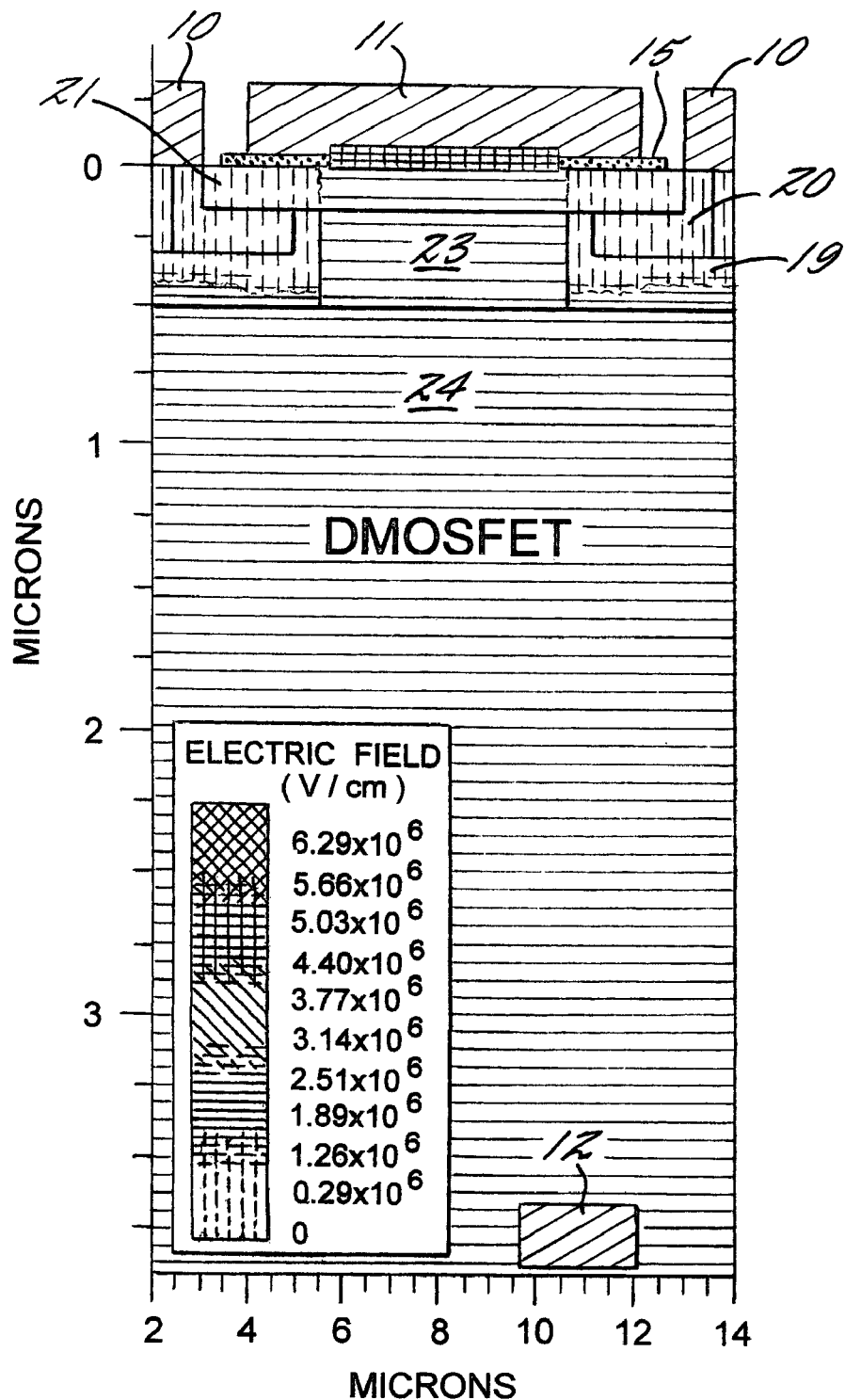
FIG. 8a is a graphic showing the electric field distribution of a DMOSFET at a blocking voltage of 1200 V.
Figure 8B:
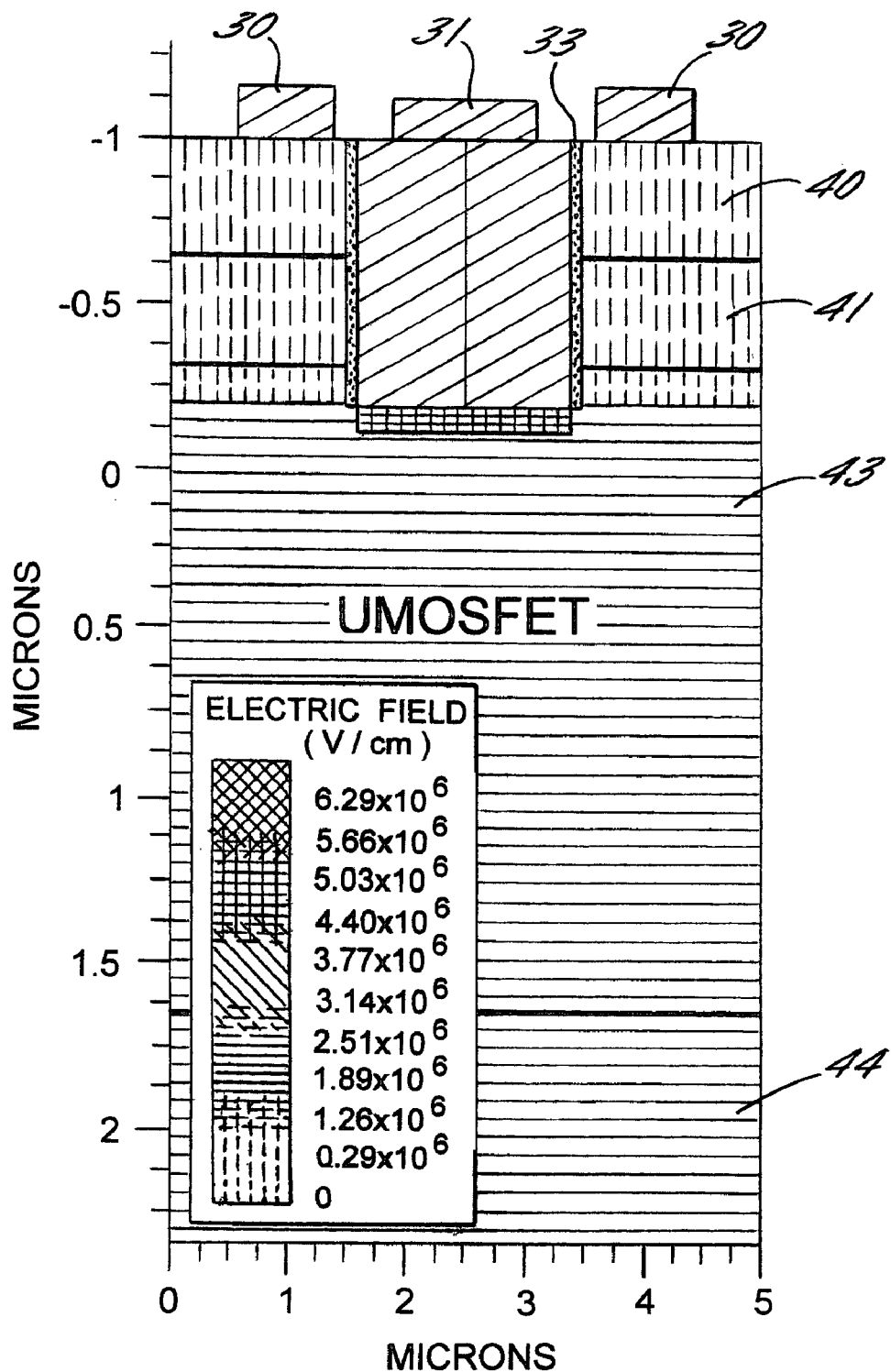
FIG. 8b is a graphic showing the electric field distribution of a UMOSFET at a blocking voltage of 1200 V.
Figure 8C:
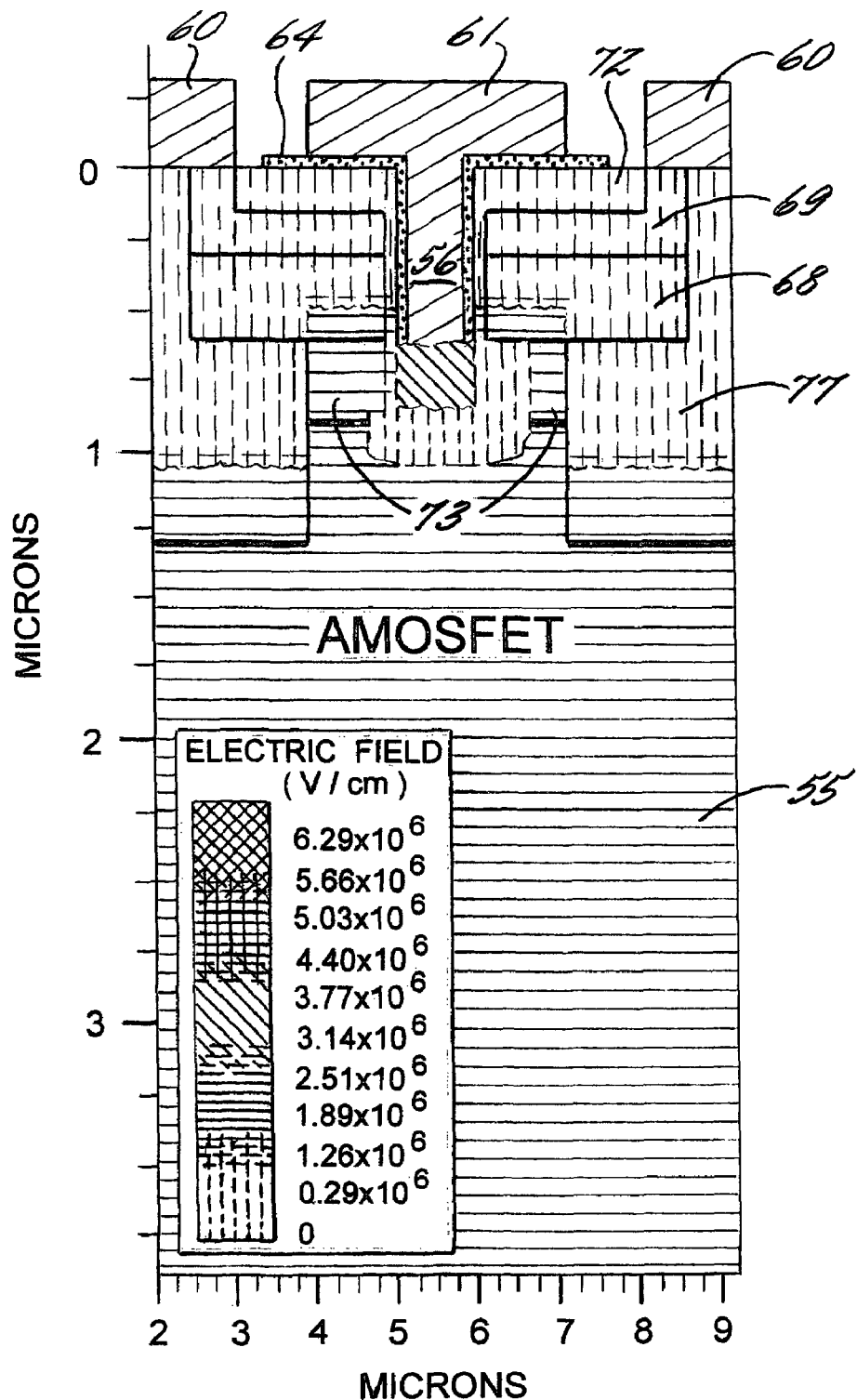
FIG. 8c is a graphic showing the electric field distribution of an AMOSFET according to this invention at a blocking voltage of 1200 V.
Figure 9A:
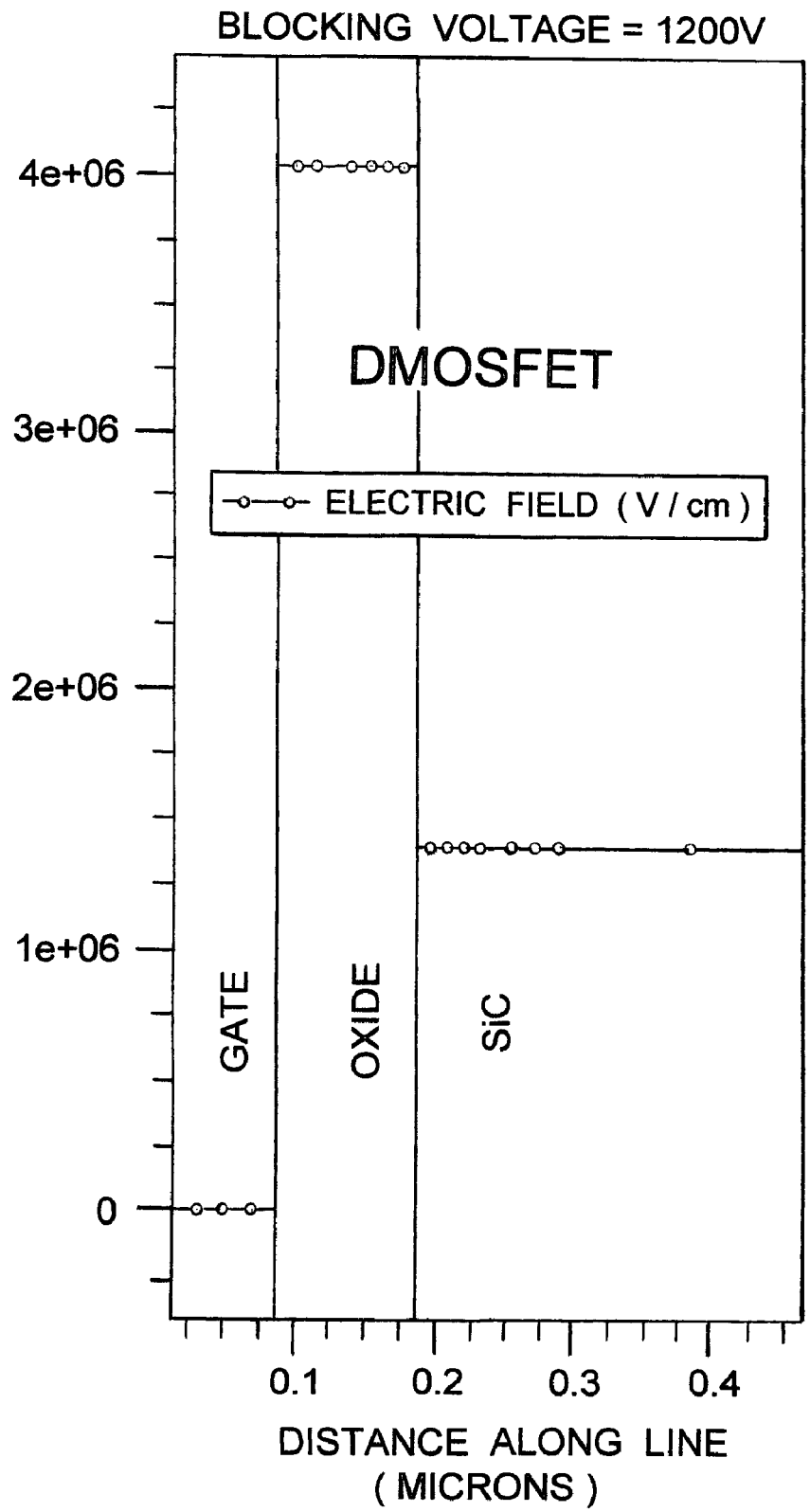
FIG. 9a is a graphic showing the maximum electric field depth in the oxide layer of a prior art DMOSFET.
Figure 9B:
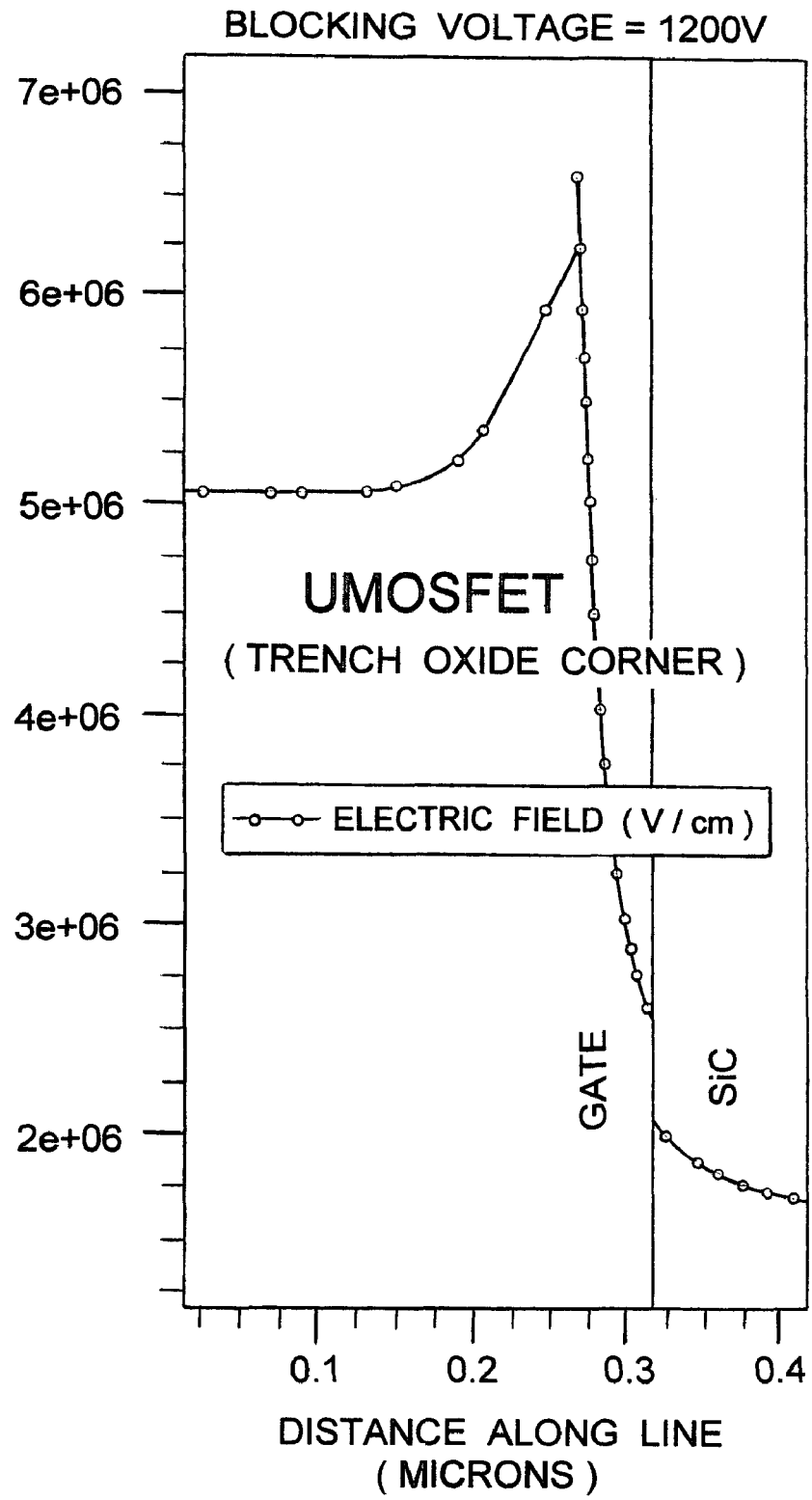
FIG. 9b is a graphic showing the maximum electric field depth in the oxide layer of a prior art UMOSFET.
Figure 9C:
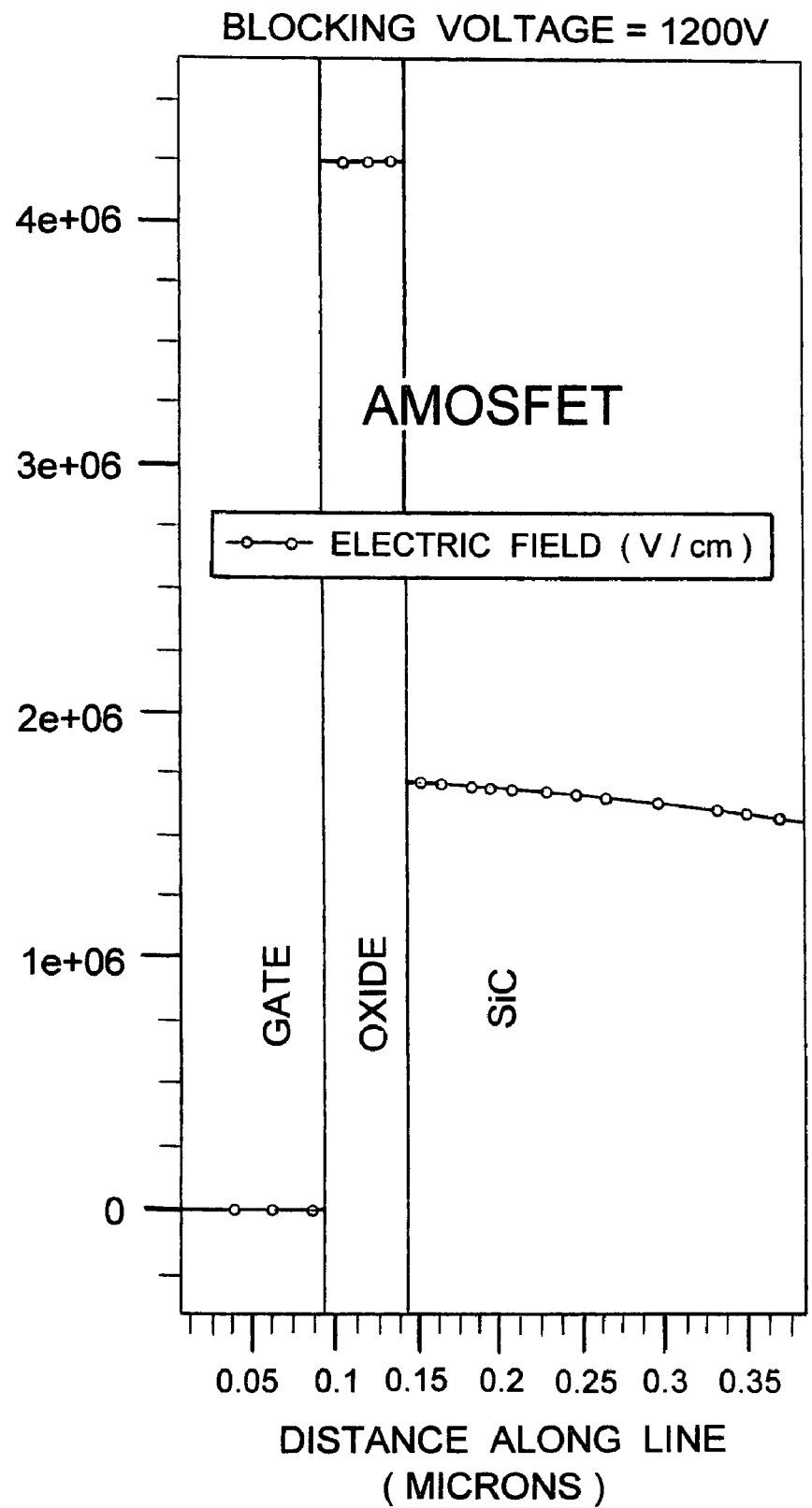
FIG. 9c is a graphic showing the maximum electric field depth in the oxide layer of an AMOSFET according to this invention.

FIGS. 8 and 9 show the advantageous electrical responses of a transistor formed according to this invention with a conductive channel on the A-face of silicon carbide. The figures compare traditional prior art DMOSFET (FIGS. 8a, 9a) and UMOSFET (FIGS. 8b, 9b) transistors with the AMOSFET (FIGS. 8c, 9c) disclosed herein.

FIG. 8 is a schematic representation of electric field distribution for the three devices (DMOS, UMOS, AMOS) upon application of a 1200V blocking voltage on the gate contact of each. In FIG. 8a, a DMOSFET of the prior art exhibits high field strength along the oxide insulating layer (15), thereby minimizing the reverse bias that the device can withstand before breaking down in that region. The prior art UMOSFET of FIG. 8b shows a similar field crowding at the intersection of the gate contact and the semiconductor walls of the trench. Field crowding at the corner of the trench in FIG. 8b prevents the device from achieving full voltage blocking characteristics. In contrast, the AMOSFET, formed according to this invention and shown in FIG. 8c, includes the buffer layer (73) and the deep well (77) that protect the trench corners from the higher field in the trench. As shown in FIG. 8c, the trench corner of the AMOSFET of this invention is exposed to an electric field less than about 1.26e6 volts/cm, which is an improvement over the UMOSFET trench of FIG. 8b which is exposed to a field strength of about 5e6 v/cm at the same blocking voltage. In accordance with these results, the AMOSFET of this invention is capable of withstanding higher reverse blocking voltages due to the improved design that includes the deep p+ well (77) and the n type buffer layer (73).

FIG. 9 illustrates the electric field in the oxide layer of each device from FIG. 8 (DMOS, UMOS, and AMOS respectively). In the traditional UMOSFET shown in FIG. 9b, the field at the trench corner is 50 percent greater than the maximum electric filed in the AMOSFET oxide layer (FIG. 9c). The AMOSFET (FIG. 9c) also spreads the field throughout the silicon carbide more evenly as opposed to the drastic drop-off of the USMOSFET of FIG. 9b. The field response for the UMOSFET exhibits the expected pattern of field crowding at the trench corner which hinders proper operation. The AMOSFET disclosed herein appropriately spreads the electric field evenly throughout the body of the device to enable a higher blocking voltage thereon.

The method of forming the AMOSFET described herein enhances technology that has been advantageously used for DMOSFETs of the prior art. The traditional methods, however, are modified to account for the fact that the AMOSFET includes a conductive channel in the A-face of a silicon carbide epilayer. As noted above, MOSFETs according to this invention optionally include a silicon carbide substrate formed by known means. A drift region (55) layer of 4H—SiC is epitaxially grown on a substrate, and then, in the enhanced embodiment of this invention, a buffer layer (73) of silicon carbide, typically doped to n-type, is formed on the drift region (55). The method includes forming at least one doped well region (77) of a first conductivity type, preferably P+. The well region (77) can be formed by any common technique but is preferably formed by implanting dopants into the semiconductor from the top of the device down to a depth that is greater than one micron. To create a pn junction within the body of the device, the method includes the steps of growing a first epitaxial layer (68) of a first conductivity type on the drift region (55) such that the first epitaxial layer (68)

covers at least a portion of the doped well region (77). A second epitaxial layer (69) of a second conductivity type is formed on the first epitaxial layer (68). The body of the AMOSFET (50) at this point includes semiconductor layers, preferably of silicon carbide, for controlling electrical conduction from top to bottom.

The next step in the process of this invention is that of etching the epitaxial layers, particularly the buffer layer (73) as well as the first and second epitaxial layers (68, 69) to form a trench within the semiconductor layers and thereby forming a pair of semiconductor mesas (65). The trench (56) preferably extends to a depth that is less than the depth of doped well region (77). A buried channel layer (72) is formed over at least a portion of the second epitaxial layer (69). The buried channel layer (72) extends into the trench (56), across the trench bottom, and continues to cover the opposite trench walls and at least a portion of the second mesa opposite the first. Afterwards, the trench wall is covered with a layer of gate insulation (64), such as silicon dioxide, on which the gate contact (61) is formed in the trench. Source and drain contacts, common in these types of transistors, complete the AMOSFET (50) herein.

It is important to note that the doping methods noted above may be modified in other variations such that the AMOSFET (50) achieves a high current output in the on-state. For example, the method of forming a transistor with a channel region along the A-face of a semiconductor body may include implanting a doped well region (77) of a first conductivity type in a semiconductor body (55) and then growing an epitaxial layer (68) of the first conductivity type on at least a portion of the well layer (77). In this embodiment of the invention, the upper portion of the first epitaxial layer (68) may be converted to an opposite conductivity type by implanting techniques that are known in the art. This upper portion of second conductivity type is then the second epitaxial layer (69) for forming a pn junction within the transistor (50). Etching the epitaxial layers forms the desirable trench for forming a gate contact (61) that controls conduction.

The method described herein can also be used to form other transistors that benefit from a highly conductive channel on the A-face of the semiconductor layers. Accordingly, this invention is not limited to MOSFETs, but is equally applicable to insulated gate bipolar transistors and metal-oxide-semiconductor controlled thyristors. The semiconductor material used for forming all of these devices is preferably silicon carbide, but the invention is not limited to such.

Those having skill in the art will recognize that the invention may be embodied in many different types of transistors device structures. Accordingly, the invention is not limited to the particular structures illustrated herein. For example, transistors may include a p-type or n-type channel, depending upon configuration. Any layer or transistor region described herein may have an opposite doping type, as the descriptions used in this document are for example only.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A transistor having an insulated control contact within a trench in a semiconductor crystal structure, the transistor comprising:
   a pair of semiconductor mesas defining the trench, said semiconductor mesas each comprising at least one p-n junction;
   a buried channel layer extending across portions of top surfaces of said semiconductor mesas and at least partially covering walls of the trench such that said buried channel layer provides a conductive path across an A-face of the semiconductor crystal structure;
   a current spreading layer extending between said semiconductor mesas and beneath the bottom of the trench to reduce junction field effect resistance in the transistor; and
   a doped well extending from at least one of said semiconductor mesas to a depth within said current spreading layer that is greater than the depth of the trench.

2. A transistor according to claim 1, wherein the transistor is an A-MOSFET.

3. A transistor according to claim 1, wherein the transistor is an insulated gate bipolar transistor.

4. A transistor according to claim 1, wherein the transistor is a metal-oxide-semiconductor controlled thyristor.

5. A transistor according to claim 1, wherein said doped well is a P+ type well doped to about $1 \times 10^{19}$ cm$^{-3}$.

6. A transistor according to claim 5, wherein one of said p-n junctions within said semiconductor mesas comprises:
   a P+ type semiconductor epitaxial layer positioned under said buried channel layer and between the trench and said P+ type well; and
   an N+ type source region on said P+ type semiconductor epitaxial layer between the trench and said P+ type well.

7. A transistor according to claim 6, wherein said P+ type semiconductor epitaxial layer is doped to about $5 \times 10^{17}$ cm$^{-3}$ and said N+ type source region is doped to about $1 \times 10^{20}$ cm$^{-3}$.

8. A transistor according to claim 6 further comprising a buffer layer extending from said doped well to the trench.

9. A transistor according to claim 8, wherein the at least one p-n junction between said P+ type semiconductor epitaxial layer, said buffer layer, and said P+ type well are sufficiently doped to merge, thereby protecting the trench corner in the off state.

10. An AMOSFET defining walls of a trench for incorporating a gate contact between first and second semiconductor mesas, the trench exposing an A-face of a semiconductor body, the AMOSFET comprising:
    a first semiconductor epitaxial layer of a first conductivity type abutting the trench;
    a second semiconductor epitaxial layer of a second conductivity type on said first semiconductor epitaxial layer;
    a buried channel layer adjacent a first surface of the AMOSFET, said buried channel layer extending across a portion of said second semiconductor epitaxial layer and continuing along a trench wall;
    a current spreading layer beneath the bottom of the trench; and
    a well region of said first conductivity type extending from said first semiconductor epitaxial layer down into the semiconductor body to a depth greater than the trench.

11. An AMOSFET according to claim 10, wherein said first conductivity type is P+, and said second conductivity type is N+.

12. An AMOSFET according to claim 10, wherein the semiconductor body comprises silicon carbide.

13. An AMOSFET according to claim 10, wherein said buried channel layer extends from an N+ source region of the first semiconductor mesa to an N+ source region within the second semiconductor mesa, thereby covering the walls of the trench.

14. An AMOSFET according to claim 13, further comprising an N+ type buffer layer between the well region and the trench.

15. A MOSFET for controlling electrical conduction within first and second semiconductor mesas defining walls of a gate trench in a semiconductor body, the MOSFET comprising:
- a P+ type semiconductor epitaxial layer abutting the gate trench;
- an N+ type source region on said P+ type semiconductor epitaxial layer;
- a buried channel layer adjacent a first surface of the MOSFET, said buried channel layer extending across a portion of said N+ type source region and continuing along a trench wall; and
- a P+ type well extending from said P+ type semiconductor epitaxial layer down into the semiconductor body to a depth greater than the gate trench;
- wherein the MOSFET controls electrical conduction in said buried channel layer along an A-face of the semiconductor body.

16. A MOSFET according to claim 15, wherein the semiconductor body comprises silicon carbide.

17. A MOSFET according to claim 15, wherein said buried channel layer extends from an N+ source region within the first semiconductor mesa to an N+ source region within the second semiconductor mesa, thereby covering the trench wall.

18. A MOSFET according to claim 15, further comprising an N+ type buffer layer between the P+ type well and the gate trench.

19. A MOSFET according to claim 18, wherein said N+ type buffer layer extends to a depth that is approximately equal to the depth of said buried channel layer.

20. A MOSFET according to claim 15, further comprising an N+ type drift layer below the gate trench and adjacent said P+ type well, said N+ type drift layer extending toward a surface of the MOSFET opposite said first surface.

21. A MOSFET according to claim 20, wherein said N+ type drift layer comprises a doping concentration that increases from said opposite MOSFET surface toward said first surface such that the most highly doped region of the N+ type drift layer is adjacent said P+ type well.

22. A MOSFET according to claim 20, comprising a semiconductor substrate adjacent said N+ type drift layer on the side opposite said P+ type well.

23. A MOSFET according to claim 15, wherein the gate trench is less than about 2 microns deep.

24. A MOSFET according to claim 15, wherein the gate trench is less than about 1 micron deep.

25. A MOSFET according to claim 15, wherein the gate trench is approximately 0.8 microns deep, and said P+ type well is approximately 1.3 microns deep.

26. A MOSFET according to claim 15, wherein said N+ type source region and said P+ type semiconductor epitaxial layer are at approximately the same fixed potential.

* * * * *